United States Patent
Ludurczak et al.

(10) Patent No.: US 10,280,073 B2
(45) Date of Patent: May 7, 2019

(54) SYSTEM WITH AN INCREASED SURFACE DENSITY OF MICROELECTROMECHANICAL OR NANOELECTROMECHANICAL DEVICES

(71) Applicant: Commissariat A L'Energie Atomique et aux Energies Alternatives, Paris (FR)

(72) Inventors: Willy Ludurczak, Grenoble (FR); Sebastien Hentz, Seyssinet-Pariset (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/389,605

(22) Filed: Dec. 23, 2016

(65) Prior Publication Data
US 2017/0183221 A1   Jun. 29, 2017

(30) Foreign Application Priority Data

Dec. 24, 2015   (FR) ...................................... 15 63325

(51) Int. Cl.
*B81B 7/02*       (2006.01)
*B81C 1/00*       (2006.01)
(Continued)

(52) U.S. Cl.
CPC .................. *B81B 7/02* (2013.01); *B81B 7/04* (2013.01); *B81C 1/00238* (2013.01); *H03H 3/02* (2013.01);
(Continued)

(58) Field of Classification Search
CPC ..... B81B 7/02; B81B 7/04; B81B 2201/0214; B81B 2207/017; B81B 2207/05;
(Continued)

(56) References Cited

U.S. PATENT DOCUMENTS

2009/0153258 A1* 6/2009 Lutz .................. H03B 5/30
                                                331/156
2010/0118372 A1* 5/2010 Usui ...................... B81B 3/004
                                                359/221.2
(Continued)

FOREIGN PATENT DOCUMENTS

FR          2 996 219 A1       4/2014

OTHER PUBLICATIONS

French Preliminary Search Report dated Sep. 7, 2016 in French Application 15 63325, filed on Dec. 24, 2015 (with English Translation of Categories of Cited Documents).
(Continued)

*Primary Examiner* — Natalia A Gondarenko
(74) *Attorney, Agent, or Firm* — Oblon, McClelland, Maier & Neustadt, L.L.P.

(57) ABSTRACT

A nanoelectronic system comprised of n microelectromechanical or nanoelectromechanical devices arranged on a connection support to electrically connect the n devices, each device with an interaction area, at least one mechanical anchor and a first terminal, a second terminal and a third terminal, the relative arrangement of the first, second and third terminals, the anchor area and the interaction area being identical or similar for the n sensors, the first terminal of each device being intended to recover a signal emitted by each representative device of the interaction area state. At least part of the devices are arranged in such a way that the geometric location of the first terminal of one of the adjacent devices is identical to the geometric location of the first terminal of said other adjacent device, the first terminals being coincident.

20 Claims, 9 Drawing Sheets

(51) Int. Cl.
*B81B 7/04* (2006.01)
*H03H 3/02* (2006.01)

(52) U.S. Cl.
CPC ............ *B81B 2201/0214* (2013.01); *B81B 2203/0307* (2013.01); *B81B 2207/017* (2013.01); *B81B 2207/05* (2013.01); *B81B 2207/053* (2013.01); *B81B 2207/07* (2013.01); *B81C 2201/019* (2013.01); *B81C 2201/0195* (2013.01); *B81C 2203/038* (2013.01)

(58) Field of Classification Search
CPC .......... B81B 2207/053; B81B 2207/07; B81B 2203/0307; B81C 1/00238; B81C 2203/038; B81C 2201/019; B81C 2201/0195; B81C 1/00595; B81C 1/00587; B81C 1/00523–1/00571; B81C 1/00388–1/00634; B81C 1/0015; B81C 1/00103; B81C 1/00119; B81C 2203/00–2203/0792; B81C 2203/0707–2203/0778; B81C 99/00–99/0095; B81C 2201/00–2201/117; B81C 2201/0198; B81C 2201/0156–2201/0159; B81C 2201/0101–2201/016; B81C 1/00095; B81C 1/00031; B81C 1/00023–1/00126; B81C 1/00246; B81C 1/0069; B81C 1/00698; B81C 1/0065–1/00682; B81C 1/00841–1/00857; B81C 1/00936; B81C 1/00944; B81C 1/00055–1/00087; H03H 3/02; H01L 21/823481; H01L 21/3213; H01L 21/30604; H01L 21/84; H01L 21/762; H01L 21/31111; H01L 21/02178; H01L 21/02532; H01L 21/02592; H01L 21/764; H01L 23/34; H01L 2924/1461
USPC ....... 257/467, 401, 470, 577, 622, 468, 469, 257/415, 420, 428, 429; 359/290–298
See application file for complete search history.

(56) References Cited

U.S. PATENT DOCUMENTS

| | | | |
|---|---|---|---|
| 2010/0302617 A1* | 12/2010 | Zhou | G02B 26/0841 359/291 |
| 2011/0298553 A1 | 12/2011 | Ionescu et al. | |
| 2013/0135184 A1* | 5/2013 | Tung | B81C 1/00317 345/84 |
| 2013/0144542 A1* | 6/2013 | Ernst | B81C 1/00238 702/23 |
| 2013/0256921 A1* | 10/2013 | Huang | H01L 23/528 257/786 |
| 2015/0107336 A1 | 4/2015 | Hentz et al. | |
| 2015/0107357 A1 | 4/2015 | Hentz et al. | |
| 2016/0246000 A1 | 4/2016 | Duraffourg et al. | |

OTHER PUBLICATIONS

E. Sage et al. "Frequency—Addressed NEMS Arrays for Mass and Gas Sensing Applications", Transducers 2013, 4 pages.
Perrine Batude et al. "3-D Sequential Integration: A Key Enabling Technology for Heterogeneous Co-Integration of New Function with CMOS", 4 pages.

* cited by examiner

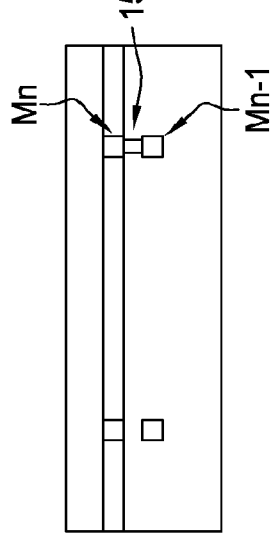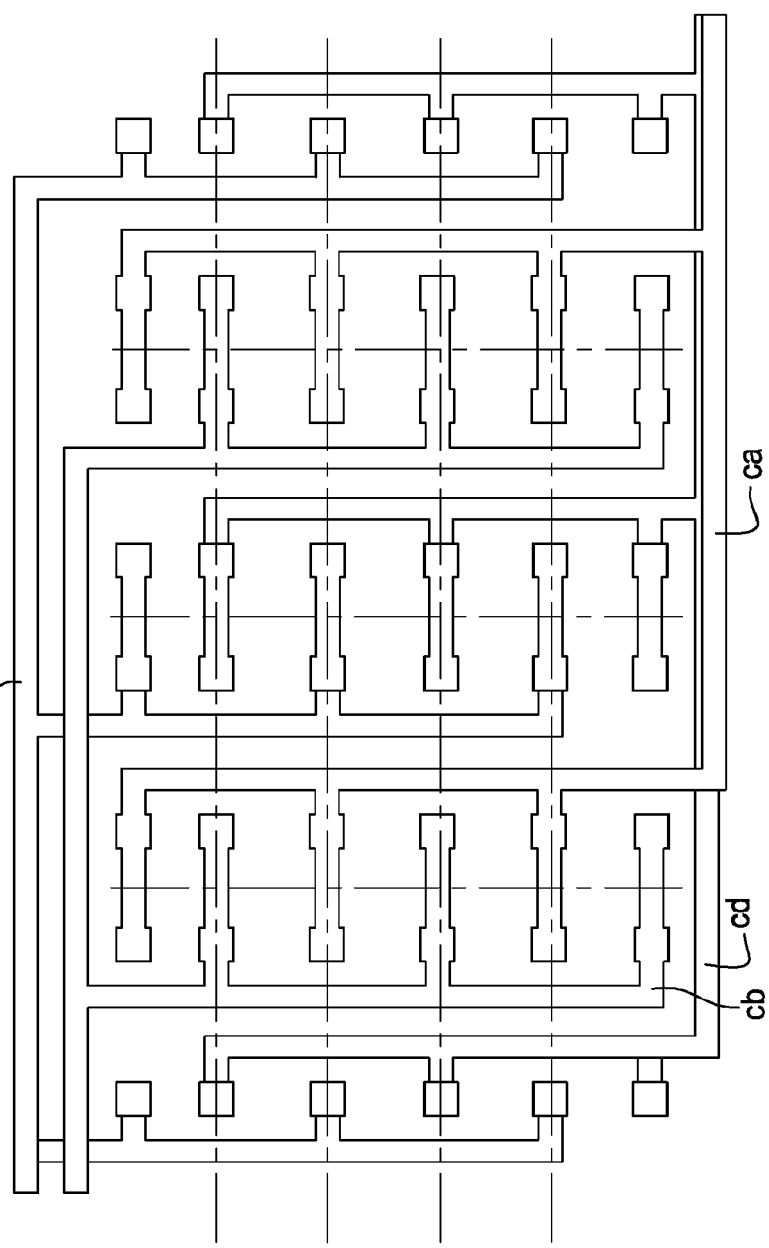

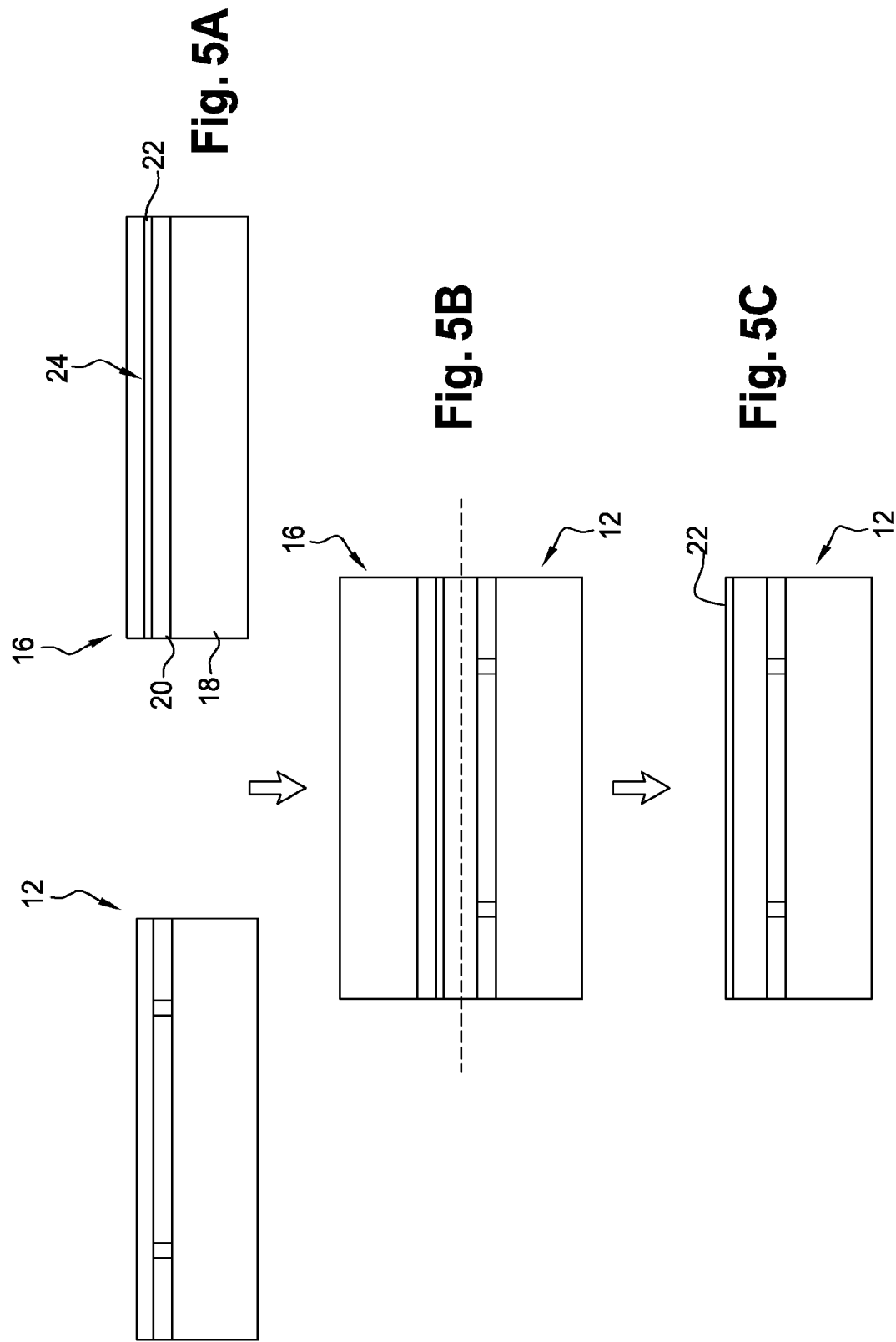

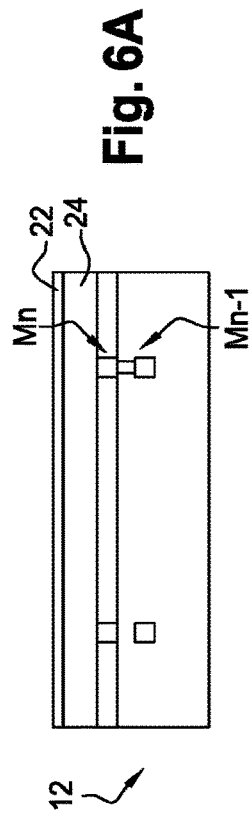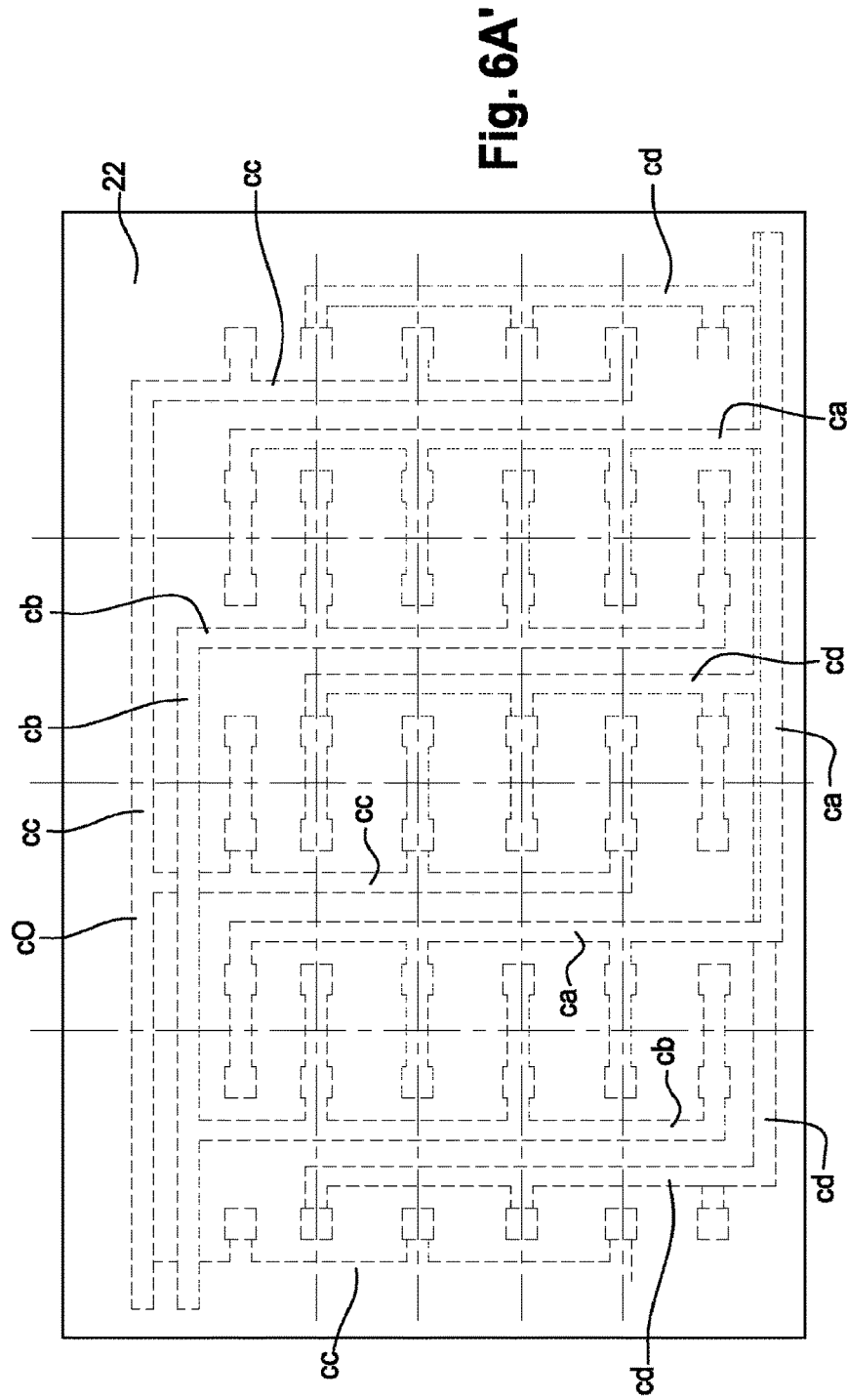

SYSTEM WITH AN INCREASED SURFACE DENSITY OF MICROELECTROMECHANICAL OR NANOELECTROMECHANICAL DEVICES

TECHNICAL FIELD AND PRIOR STATE OF THE ART

This invention relates to a system having an increased surface density of microelectromechanical or nanoelectromechanical devices, and in particular an analysis system offering a lowered detection limit.

The microelectromechanical (MEMS) devices and nanoelectromechanical (NEMS) devices, including resonator type MEMS and/or NEMS devices, can be used as sensors to perform the analysis of a liquid or gaseous media.

For example, these MEMS or NEMS devices are used as gas sensors, as biological sensors to detect the presence of biological cells in a liquid media, or as a mass spectrometer. We are generally looking to lower their detection limit in order to quantify the amount of material measured as accurately as possible and to detect highly dispersed or diluted species in a large volume of a carrier element such as a gas or gas mixture or liquid.

In the case of gas sensors, the MEMS or NEMS device has an interaction area that can comprise a functionalization layer with a particular chemical affinity to certain species to be measured: the particles are then absorbed on the interaction area in an even manner over the entire surface of the interaction area. When the concentration to be measured becomes very low, the probability of capture of species by the interaction area which exposes a reduced surface, particularly in the case of a NEMS, becomes very low.

In order to increase this probability, MEMS and/or NEMS networks, are collectively addressed to take advantage of the great sensitivity of the resonators, but also a large capture area.

In the case of a biological sensor, the resonating device is positioned in a liquid media containing the biological cells to be detected. It may be possible that cells may be individually detected when their concentration is very low. In order to provide a large capture area, resonator networks can be used, where the resonators are being individually addressed or not.

In the case of mass spectroscopy implementing a NEMS, we seek to measure the mass of each particle (e.g. biological) of a mixture initially in liquid phase, that it has just been projected onto the NEMS under vacuum, in order to go back up to the mass spectrum of the mixture content for biomedical identification applications for example. This system uses a single NEMS to detect the particles projected on its surface, about 1 $\mu m^2$, whereas the particle beam, depending on the type of injection system, can have a projected surface of a few $mm^2$ to a few $cm^2$. An additional problem may arise in mass spectroscopy compared to the two previous applications: the purpose here is to measure the mass of a particular particle, or in any case smaller than the resonator surface and not distributed on it. Yet the frequency shift induced by the addition of a particle depends not only on its mass, but also on its arrival position on the resonator. It is therefore necessary to measure in real time no just a single resonance frequency, but several resonance frequencies.

For example, you may want to detect a cell of the order of 10 to 100 nm on a surface of 1 $mm^2$. A density of approximately 1000 NEMS/$mm^2$ may then be required.

Document "*FREQUENCY-ADDRESSED NEMS ARRAYS FOR MASS AND GAS SENSING APPLICATIONS*", E. Sage, O. Martin, C. Dupré, T. Ernst, G. Billiot, L. Duraffourg, E. Colinet and S. Hentz, CEA, LETI, MINATEC Campus, 17 rue des Martyrs, 38054 GRENOBLE Cedex 9, France. Transducers 2013 16 Jun. 2013-20 Jun. 2013 Barcelona Spain describes a network in which the NEMS are interconnected in parallel and are addressed based on a frequency. Each NEMS has its own resonance frequency, which allows to distinguish it from the other NEMS and to connect them in parallel. Each NEMS has several terminals used to excite the resonant part, polarize the NEMS and collect the signals. Each NEMS connection terminal is connected by a connection track to a contact. The result is that all the terminals having the same function are connected to one contact by a connection track. As many connection tracks as there are terminals are therefore required.

Building of such connection tracks consumes space which results in the limitation of the NEMS density, and in addition, the building process is complex.

DISCLOSURE OF THE INVENTION

It is therefore a goal of this invention to provide a system with an increased surface density of MEMS and/or NEMS device compared to systems of the state of the art.

The goal stated above is achieved by a system comprising a plurality of MEMS and/or NEMS devices each comprising an interaction area and terminals for connection to outside, at least two terminals of two adjacent MEMS and/or NEMS devices having the same geometric location so that the terminals are coincident.

Preferably, all MEMS and/or NEMS devices have the same number of terminals and all have the same relative positioning of the terminals with respect to the interaction area.

In this application, "interaction area" means an area configures either to interact with the external environment, for example in absorbing one or more particles, or by exchanging heat with its surrounding environment when the implementation is in an analysis system, or act as an actuator.

The footprint is reduced compared to the state of the art system in which each NEMS has its own terminals, the terminals being connected by electrical connections to a common contact.

In other words, it pools at least a part of the terminals, which produces significant space savings.

Advantageously, several terminals, in an even more advantageous manner, all the terminals are pooled between adjacent MEMS or NEMS devices.

In one example, each MEMS and/or NEMS device pools a terminal with an adjacent MEMS and/or NEMS device and the terminals from the same MEMS and/or NEMS device pools its terminals with different adjacent MEMS and/or NEMS devices.

Thus, instead of devices having MEMS and/or NEMS arranged side by side, whose footprint is geometrically distinct from that of adjacent NEMS and/or MEMS, the footprints of the MEMS and/or NEMS devices partially overlap on the support.

The interaction areas are unique to each device and each MEMS and/or NEMS device that has at least one pooled terminal.

Very advantageously, the network of MEMS and/or NEMS devices is connected by a CMOS (Complementary Metal Oxide Semiconductor) type substrate using the interconnection levels of the CMOS circuit, including several levels of metal and vias to ensure the routing of signals, these levels being located above the CMOS. These levels of interconnections are called BEOL (Back End of Line) with multilevel metallization.

The subject-matter of this invention is therefore a microelectronic and/or nanoelectronic system comprised n microelectromechanical or nanoelectromechanical devices, n being greater than or equal to 2, arranged on a connection support used to electrically connect the n devices, each device having an interaction area, at least one mechanical anchor, at least one first electric terminal to recover a signal emitted by each device representative of the state of the interaction area, at least a second electric terminal and third electric terminal, each terminal with a given function. Among the n devices, at least some of the devices is arranged in such a way that the geometric location of at least one of the terminals of the first, second and third terminals of one of the adjacent devices is identical to the geometric location of the other terminal of said other adjacent device having the same function, said terminals of said two adjacent devices being coincident.

In this application, "connection support" means any structure with electrical routes to connect the devices between them and/or to an external device. For example, this support may be an electrical interposer, conductive lines in a substrate, a CMOS structure . . . .

The devices can be connected in parallel or in series.

Another subject-matter of the invention is a medium analysis system, comprising a system of MEMS and/or MEMS devices according to the invention and a control unit connected to the devices by the connection support.

Another subject-matter of this invention is an activation system, comprising a system of MEMS or NEMS devices according to the invention and a control unit connected to the devices by the connection support.

BRIEF DESCRIPTION OF THE DRAWINGS

This invention will be better understood based on the description that will follow and the appended drawings on which:

FIGS. 4A and 4B are top and section views respectively of a CMOS circuit comprising the interconnection of networked MEMS and/or NEMS devices, FIGS. 5A to 5C are schematic representations of the CMOS circuit assembly of FIGS. 4A and 4B and a substrate in which the network of MEMS and/or NEMS devices is intended to be embodied, FIGS. 6A to 6E' are schematic representations of the top and side views of the different embodiment stages of the networked MEMS and/or NEMS devices and the interconnection of MEMS and/or NEMS devices,

DETAILED DESCRIPTION OF THE INDIVIDUAL EMBODIMENTS

Figure 1:
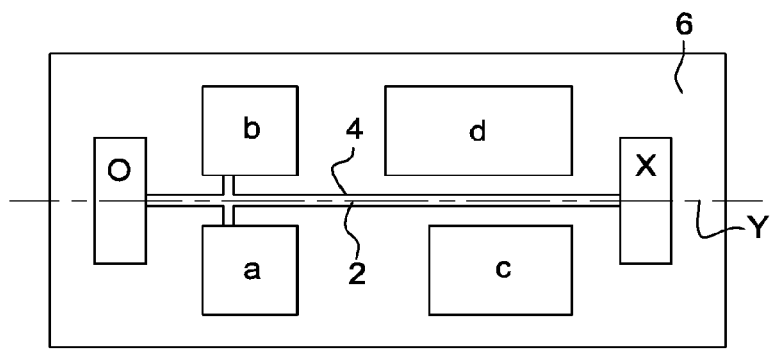
FIG. 1 is a top view representing schematically a MEMS and/or NEMS device that can be implemented in a system according to the invention.

In FIG. 1 you can see an example of a MEMS and/or NEMS device that can be implemented in the embodiment of a system or network of MEMS and/or NEMS devices. For purposes of simplicity, a MEMS and/or NEMS device will be designated as "NEMS".

The NEMS has an interaction element applied to an interaction area 2 and terminals a, b, c, d, O, and X. In the example shown, the interaction element is configured to be mobile, the NEMS type being resonant. When one or more particles come to be adsorbed or to be absorbed on the interaction area, the mechanical resonant frequency varies, it is the detection of this variation that allows to deduce the mass and type of the particles. The interaction area is for example carried by a beam or a membrane 4 suspended with respect to support 6.

As a variant, rather than the molecules or particles depositing on the interaction area, we can measure a variation of the conductivity of the ambient medium, for example due to the change in composition of the surrounding media, this variation of conductivity inducing a resonance frequency variation. Alternatively again, we can measure a variation of the surrounding electrostatic potential, for example due to adsorption of an ionized particle, this variation of the electrostatic potential inducing a variation of the resonance frequency.

The terminals are used for the operation of the NEMS and its integration into the network.

Terminal X is arranged at a longitudinal end of the beam 4. Terminal X is mainly intended as a mechanical anchor for the interaction element on the support 6. It may also have an electrical function.

Terminals O, a, b, c and d are electrical terminals.

Terminal O is located at the longitudinal end of the beam opposite to terminal X. Terminal O forms the detection signal output of the interaction area.

Terminals c and d are arranged laterally with respect to the longitudinal axis Y of the beam on both sides of the longitudinal axis Y. Terminals c and d are electrodes that, with the sides of the beam, form the actuation means or capacitive excitation, capable of causing vibration at its mechanical resonance frequency. Terminals a and b are arranged laterally with respect to the longitudinal axis Y of the beam on both sides of the longitudinal axis Y. Terminals a and b are mechanically connected to the beam by piezoresistive gauges, better yet piezoresistive nanogauges, terminals a and b ensure the polarization of the nanogauges. Alternatively, a single gauge could be implemented.

When we wish to read the response of one of the NEMS, the output signal collected at the terminal O contains the amplified signal of said NEMS and the signals of all other NEMS that form a sound. The addressing and operation of a network of resonant NEMS is described in document "*FREQUENCY-ADDRESSED NEMS ARRAYS FOR MASS AND GAS SENSING APPLICATIONS*", E. wise, O. Martin, C. dupre, T. Ernst, G. Billiot, L. Duraffourg, E. Colinet and S. Hentz, CEA, LETI, MINATEC Campus, 17 street of the Martyrs, 38054 GRENOBLE Cedex 9, France. Transducers 2013 16 Jun. 2013-20 Jun. 2013 Barcelona Spain.

It will be understood that the number of terminals is not limiting, it could be less than 6 or more than 6.

Any device that is able to be distinguished from other devices other than by its geographical location and electrical connections can be implemented to produce a high density network according to the invention. For example, you can implement the NEMS for which the electrical resistance variation is measured, for example of piezoresistive type or for which we measure a capacity variation. Each NEMS presents an initial resistance or an initial capacity different than the resistances or capacities of the other NEMS.

Figure 6B:
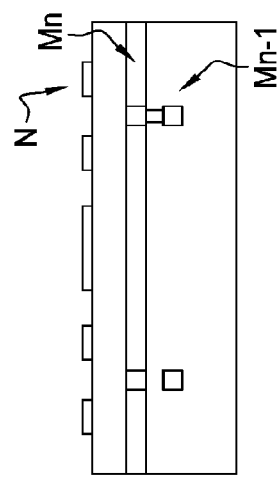
Figure 6B:
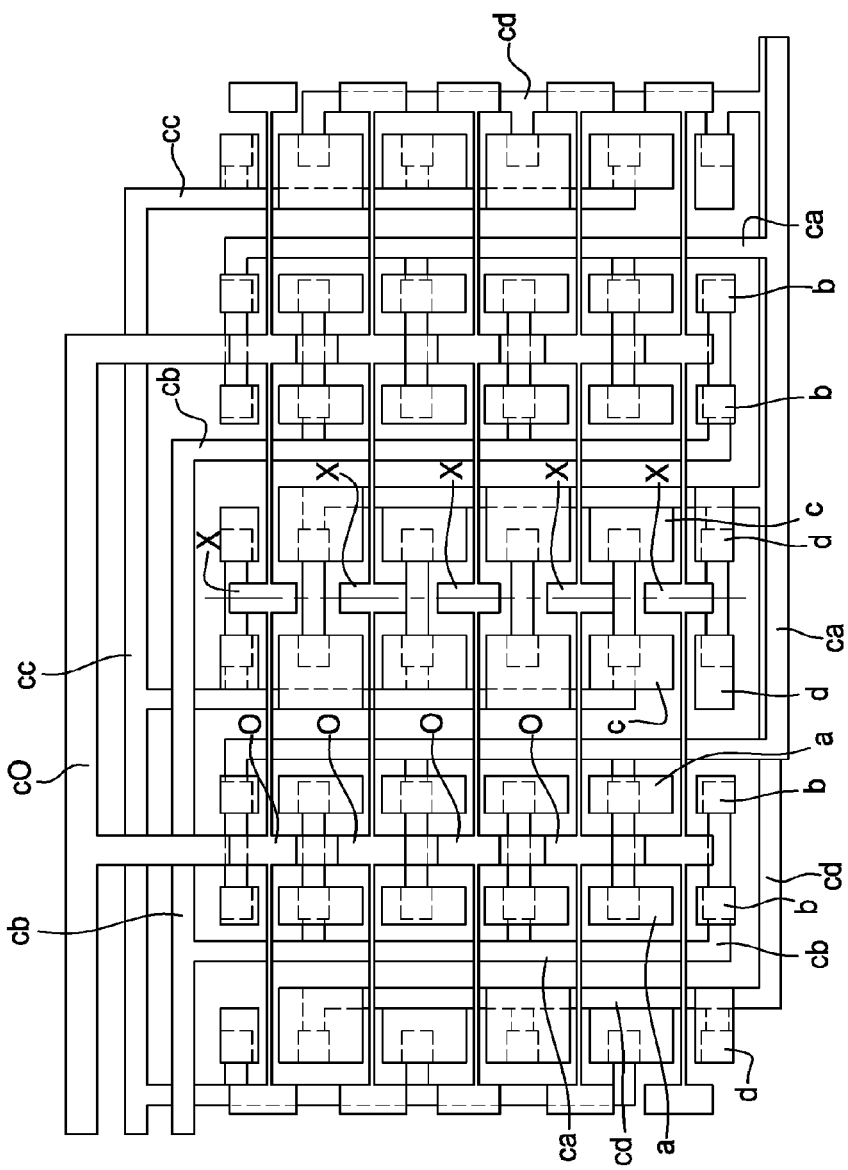
Figure 6C:
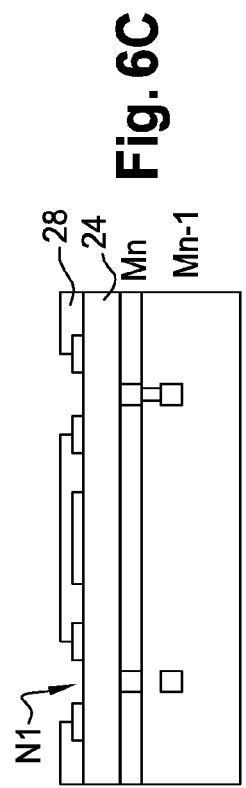
Figure 6C:
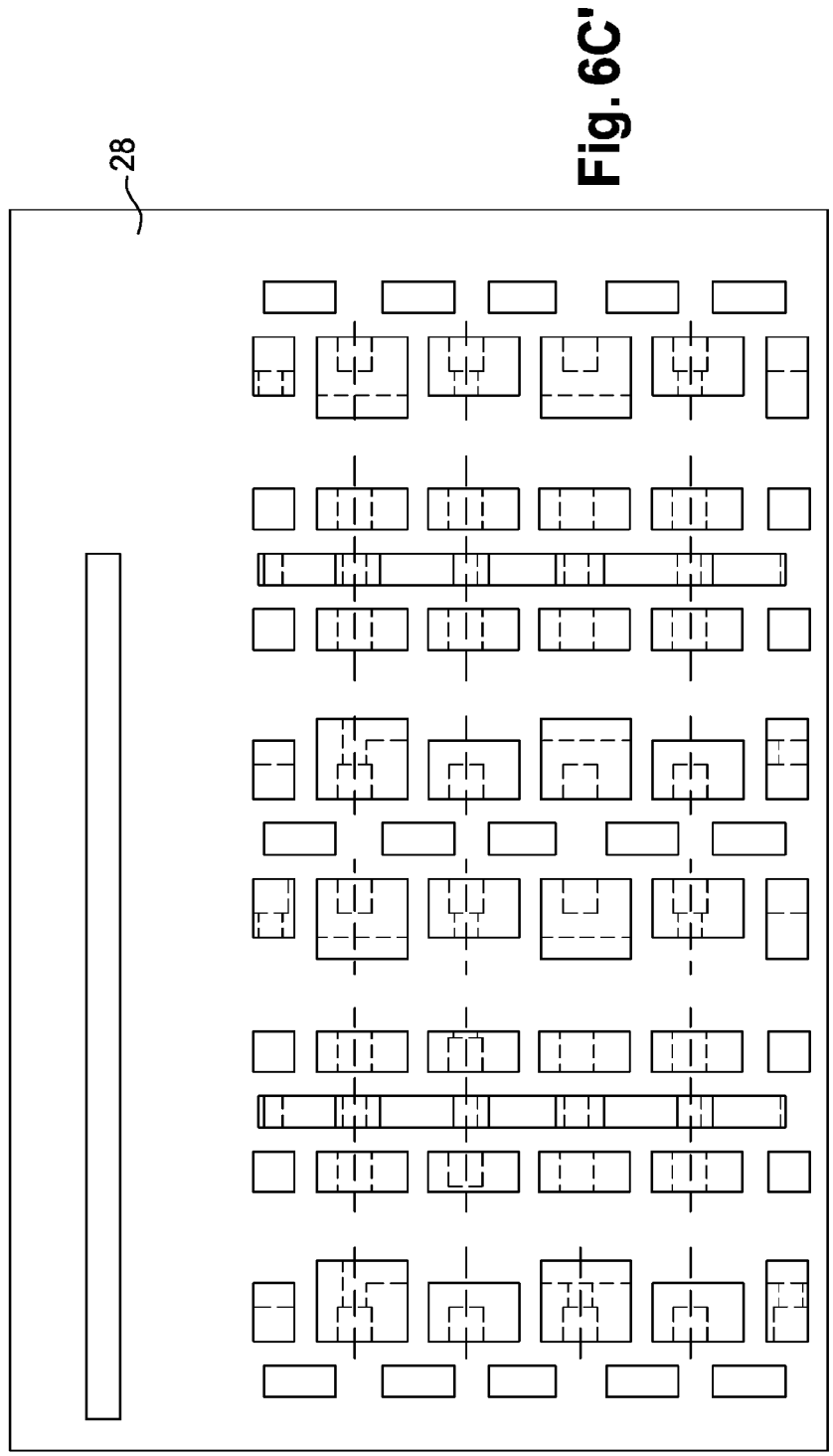
Figure 6D:
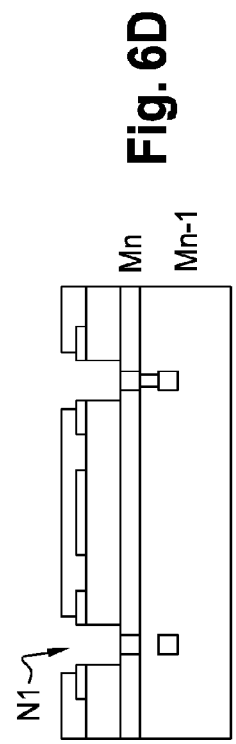
Figure 6D:
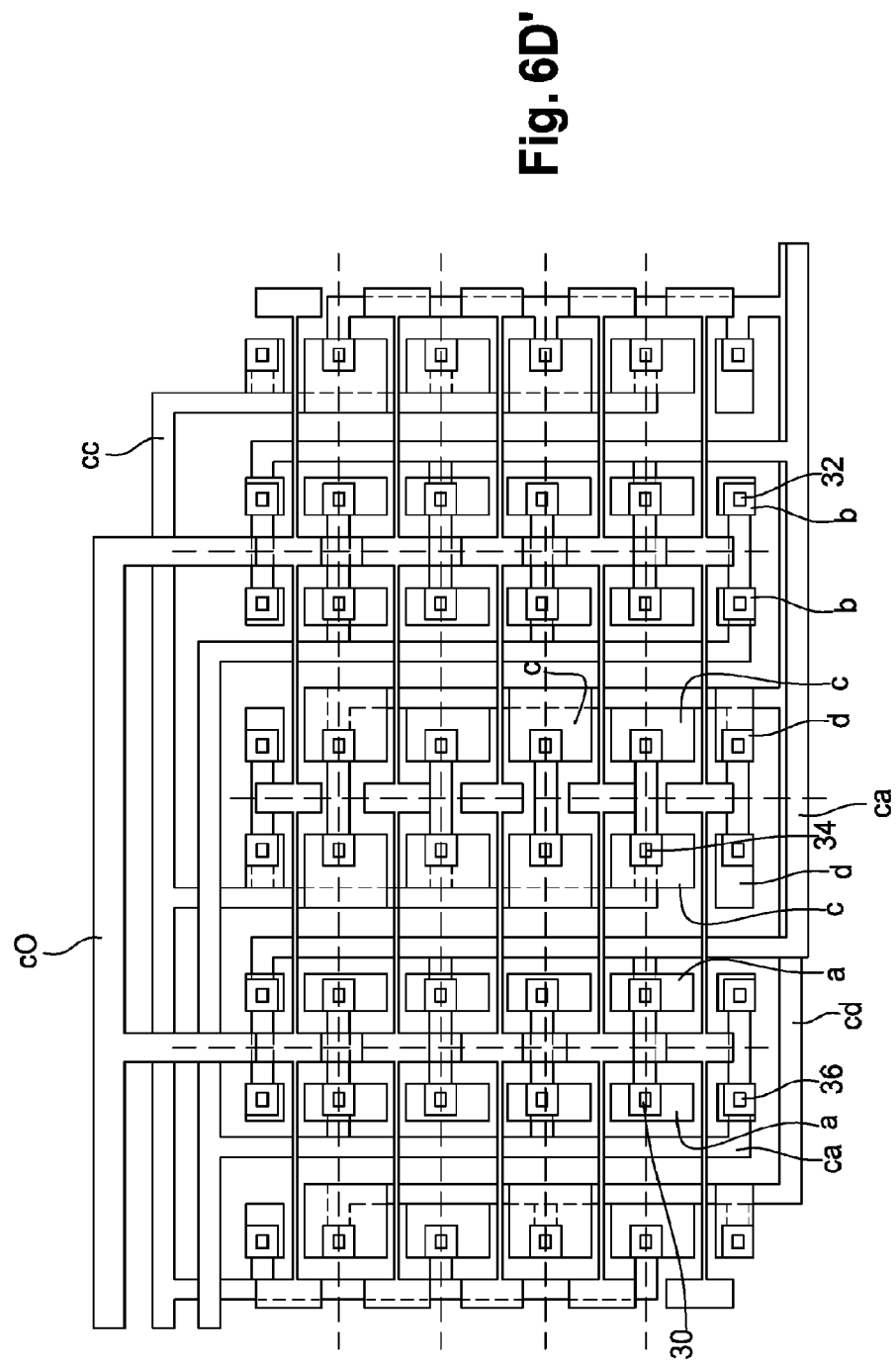
Figure 6E:
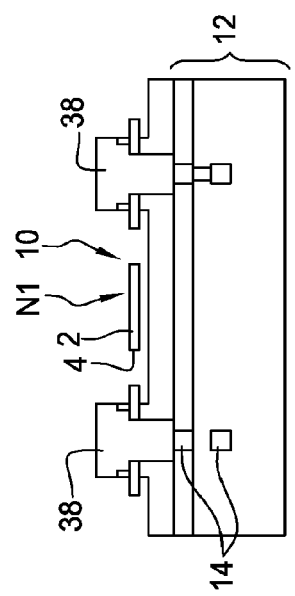
Figure 6E:
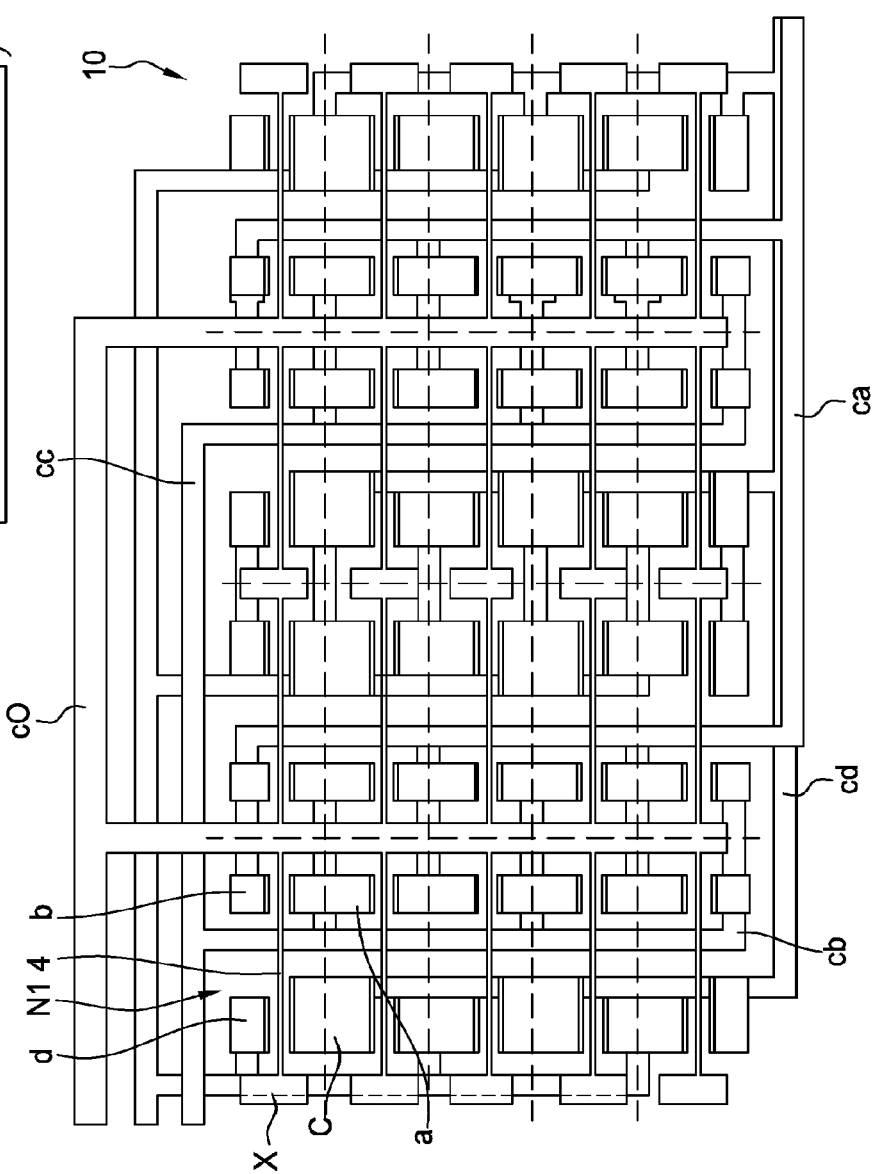

On FIG. 6E, we can see a schematic representation of a system of NEMS according to the invention. It is comprised of a stack that includes a network of NEMS 10 and a connection support substrate 12 from the NEMS network, the NEMS network comprising interconnections 14 of the NEMS, connecting the NEMS in parallel.

The network 10 includes a plurality of NEMS arranged in rows and columns. All the NEMS are arranged the same way relative to terminals a, b, c, d and O and X with respect to the interaction area and between each other.

Also, the interaction element can be set moving off the plane, in particular where the NEMS is used as an actuator.

The NEMS can all be addressable individually. In the embodiment in which the NEMS are of type resonant, each NEMS has its own resonance frequency distinct from those of the other NEMS, which allows to differentiate them. The resonant frequency is for example set by the dimensions of the NEMS, for example by the dimensions of the interaction element, by the stiffness of the interaction element and/or its means of suspension . . . . For example, the NEMS all have different dimensions. In the case of NEMS with beams, since the frequency of a beam is proportional to the ratio of the vibrating width over the length squared, the NEMS can be created with a beam length different from that of the beams of the other NEMS.

Alternatively, we can consider that the NEMS are group addressable, each group having for example the same resonant frequency.

Figure 2:
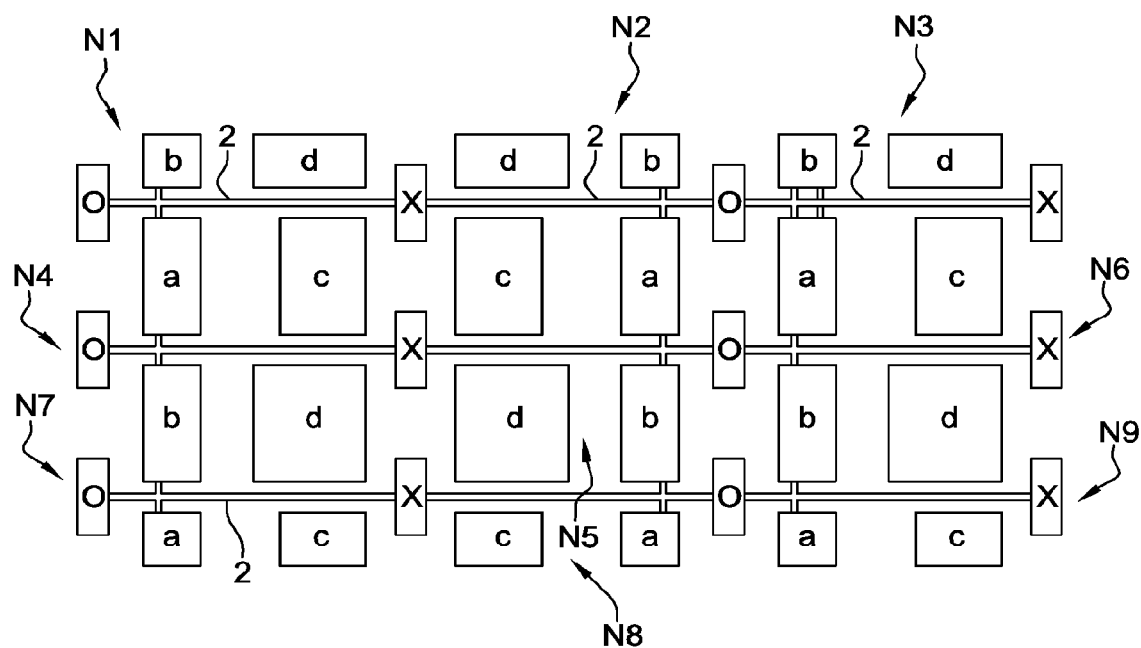
FIG. 2 is a top view of a network of MEMS and/or NEMS devices in a very advantageous embodiment example of the invention.

In FIG. 2, we can see an example of a particularly advantageous arrangement of NEMS according to the invention. The NEMS are arranged so that the terminals having the same functions can be common to two adjacent NEMS. In the very advantageous example of FIG. 2, since all the terminals that can be pooled are pooled in order to maximize the reduction of space not used between the NEMS and increase surface density of the NEMS.

At the same time, the electrical terminals O, a, b, c and d are pooled but mechanical terminals X are also.

The network in FIG. 2 has 9 NEMS designated as N1 to N9, NEMS N1 to N3 are on the first line, NEMS N4 to N6 are on the second line and NEMS N7 to N9 are on the third line.

Advantageously, the NEMS are arranged so that two common terminals of the same type are against each other to simplify the interconnection.

In the example shown, NEMS N1 and N2 have terminal X in common and NEMS N1 and N4 have terminals a and c in common.

Since NEMS N5 has its terminals a and c in common with NEMS N2, has its terminals b and d in common with NEMS N8, has its terminal O in common with N7 and has its terminal X is in common with N4, it therefore shares all its terminals.

Figure 3A:
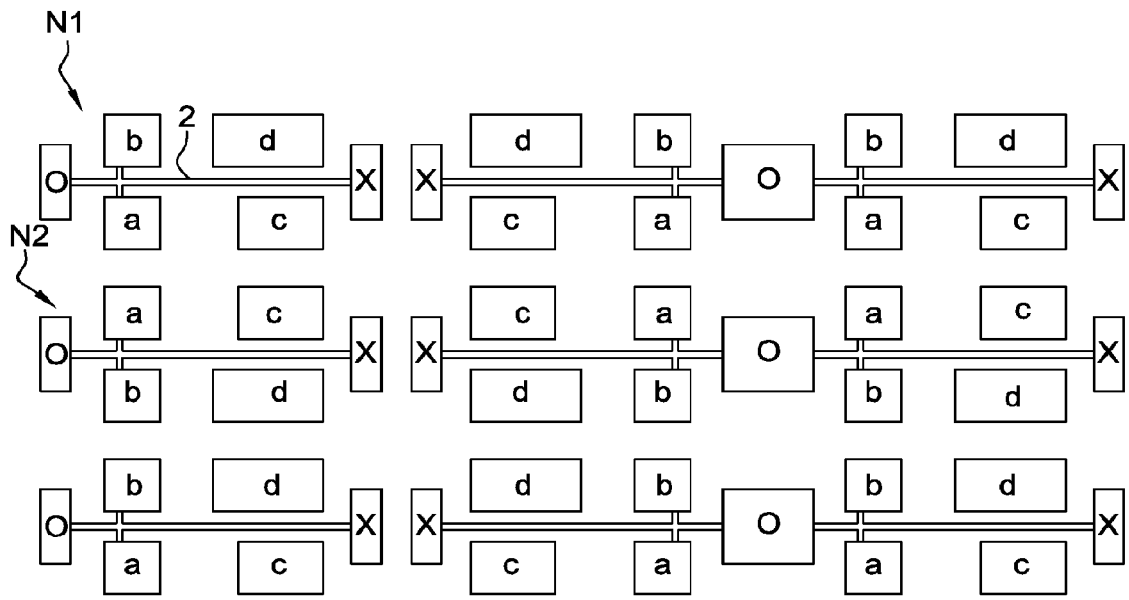
FIGS. 3A and 3B are top views of other examples of network embodiments of MEMS and/or NEMS devices.

In FIG. 3A, you can see another example of a network in which the NEMS only have their terminal O in common. Each NEMS shares terminal O with a neighbour NEMS. In the example shown, these are NEMS arranged in a single line.

Figure 3B:
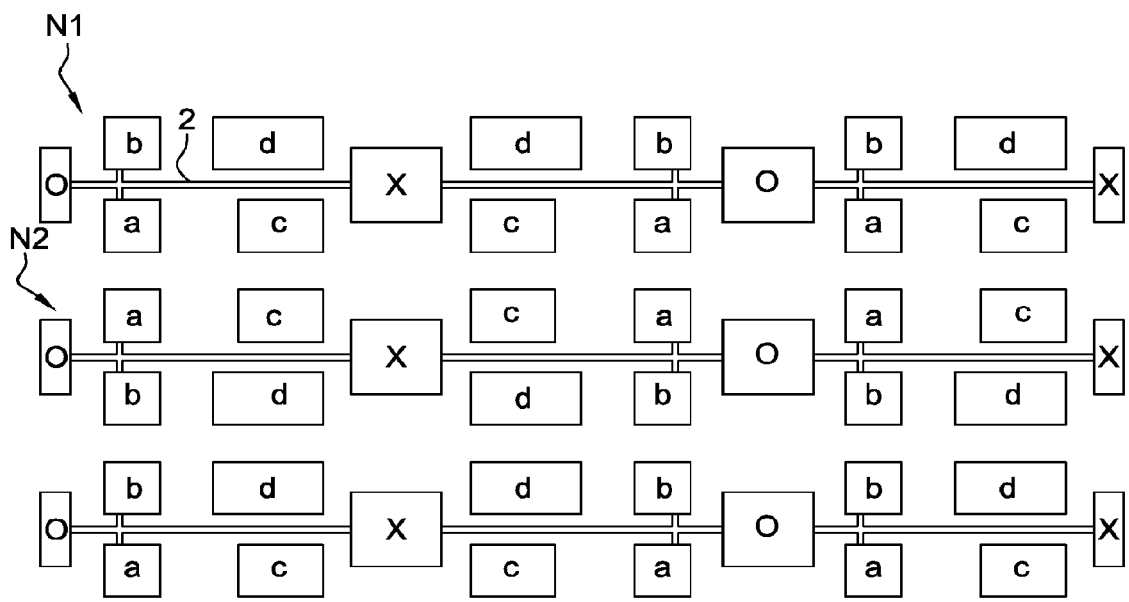

We can advantageously plan that the NEMS pool the terminals O and X as can be seen in FIG. 3B.

In the examples in FIGS. 3A and 3B, the NEMS are arranged with respect to each other so that both terminals of two adjacent NEMS having the same function face each other, but it will be understood that this arrangement is not limiting, for example a terminal a could face a terminal b and a terminal c could fade a terminal d.

Even more advantageously, the NEMS also pool at least one of their terminals a, b, c or d, or even several.

Preferably, as this has been described, all terminals are pooled (FIG. 2).

As we can see from FIG. 2, the NEMS arranged on the outside of the network have terminals located outside that are not pooled. Terminals b and d of NEMS N1, N2, N3 are not pooled, terminals a and c of NEMS N6, N7 and N8 are not pooled, terminals O of NEMS N1, N4, N7 are not pooled and terminals X of NEMS N3, N6, N9 are not pooled.

For example, we could also plan to pool some of the external terminals by considering the representation of FIG. 2, where we can plan to pool terminals d and/or terminals b located on the upper outside edge of the network and/or terminals a and/or terminals c located on the lower outside edge of the network, for example by reducing the size of terminals X and O and/or by changing the dimensioning of terminals b and d.

We will now describe an example of a connection support 12 electrically connecting terminals a, b, c, d, and O, pooled or not, to a control unit. Very advantageously, the connection support is a BEOL of a CMOS substrate, the BEOL (Back-end Of the Line) is the part with the interconnections between different devices carried by the integrated circuit or system. In this case, the BEOL has interconnections of the NEMS from the network, in parallel or in series, for the purpose of connecting to a control unit In FIG. 4, we can see a cross section of a BEOL example and in FIG. 4B we can see a top view of the BEOL conductive tracks providing a connection in parallel to the NEMS, more precisely providing a connection in parallel to each terminal a, b, c, d of a NEMS with terminals a, b, c, d of the other NEMS in the network, respectively. As we will see later, the connection in parallel of terminals O is embodied during the embodiment of the NEMS, but is certainly not limiting and it could also be embodied in the BEOL.

The interconnections are distributed in two levels Mn and Mn-1, where level Mn-1 is the one located closest to the free face 4 of the BOEL on which the layer, in which the NEMS will be embodied, will be formed.

Levels Mn and Mn-1 are levels of metallization in which connections ca, cb, cc, cd are structured, intended to be interconnected to terminals a, b, c, d respectively.

Advantageously, we embody several connection types in the same level of metallization so as to reduce the number of metallization levels. Advantageously, connections ca and cb are embodied in level Mn, and connections cc and cd are embodied in level Mn-1. It is possible to embody connections ca and cb in the same level since the connections do not intersect as can be seen in FIG. 4B, the same for cc and cd connections.

In the example shown, all terminals b are interconnected by a single connection, but could be made to implement several connections of the same type.

Very advantageously, all the connections ca, cb, cc, cd have the same configuration, but their orientations are different. The embodiment process is thus simplified. But it will be understood that the connections, with configurations where one is different from the other, do not exceed the framework of this invention.

In the example shown, each connection interconnects terminals from 20 NEMS.

Alternatively, there could be three levels of metallization, two levels with only one type of connection, or even four levels of metallization each level with only one type of connection.

In the example shown, vertical connections or vias 15 are embodied in level Mn for the purpose of connecting later to level Mn-1 and terminals c and d of the NEMS. These vias do not electrically connect connections ca, cb of level Mn to connections cc, cd of level Mn-1.

An example of a manufacturing process of a system with a network having the configuration in FIG. 2 will now be described in relation to FIGS. 5A to 5C and 6A to 6D'.

Preferably, in a first step, the connection support 12 is embodied, it is preferably a BEOL as described in FIGS. 4A and 4B, each BEOL interconnection level can be embodied by structuring metal lines, by filling with oxide, more generally with dielectric material, the areas between the lines and by embodying vias to produce the resumptions of contact. The next level of interconnection is achieved in the same way. It is represented schematically in FIG. 5a.

In a next step, we assemble the connection support 12 and a substrate 16 in a layer in which the NEMS will be embodied. Preferably, this is an insulation type substrate on silicon or SOI (Silicon On Insulator) (FIG. 5A). The substrate is comprised of a thick substrate 18, a layer of dielectric material 20 such as an oxide, and a layer of monocrystalline silicon 22 on the front face.

Alternatively the substrate 16 can be a solid substrate, such as diamond, which is then thinned.

In a next step, the connection support substrate 12 and SOI substrate 16 are assembled for example by pasting using TEOS oxide so that the Silicon layer 22 is against the BEOL. The two sides to bind are comprised of oxide (for example, TEOS for tetraethyl orthosilicate) planarized by physico-chemical polishing for a good flatness. Then both sides are bonded by molecular bonding.

The resulting element is shown in FIG. 5B.

In a next step, we perform a thinning of the substrate 16 on its rear surface to remove any thick substrate 18 and the oxide layer 20. The thinning is done for example by dry or wet grinding, then by physical-chemical polishing.

The Silicon layer 22 is separated from the BEOL by the bonding interface 24.

The layer of monocrystalline silicon 22 is in front face of the assembly.

The resulting element is shown in FIG. 5C.

We will now describe the embodiment of the NEMS in the layer 22.

In FIG. 6A, we can see in detail the element of FIG. 5C.

In FIG. 6A', we can see a top view schematic representation of the element in FIG. 6A, connections ca, cb, cc, cd being visible by transparency through the layer 22.

In one of the next steps, we embody a structuring of the layer 22 in order to embody the NEMS in the layer 22. The structuring of the layer 22 is made by conventional microelectronic and nanoelectronic techniques using mask deposit, lithography photos, for example optical or electronic and liberation steps.

At the same time, we embody the cO connection. As a variant, the cO connection might be embodied in the connection support, for example in a level Mn-2, terminals O would then be connected to the cO connection through vias in a way similar to the terminals a, b, c, d.

The resulting element is represented in FIGS. 6B and 6B'. In FIG. 6B', you can see the individualised NEMS. At this stage, the NEMS are not linked electrically to the ca, cb, cc, cd connections as can be seen in FIG. 6B.

In a next step, we form a passivation layer 28 on the NEMS, for example TEOS oxide and we open this layer with a stop on the NEMS Silicon to set the locations of the vias and the routing of the metallization layer.

In a next step, the different NEMS terminals are electrically connected to connections ca, cb, cc, cd using vias through the bounding interface 24.

The resulting element is represented in FIGS. 6C and 6C'.

In a next step, we first embody cavities 30, 32, 34, 36 in terminals a, b, c, d respectively to connections ca, cb, cc, cd. In the case of the terminals c and d to connect to connections cc and cd located in the level Mn-1, cavities 34 and 36 lead to the vias 15. For this, we etch the interface layer 24.

The resulting element is represented in FIGS. 6D and 6D'. In FIG. 6D', the layer 28 is not represented.

In a next step, we embody a layer of metal, for example of Cu, TiN/Ti, WSi, AlSi, Ni, to embody the contact between the bottom of the via and the NEMS in order to electrically connect terminals a, b, c, d and connections ca, cb, cc, cd. The metal layer is then structured so as it only preserves one level of vias. Then we engrave layers 24 and 28, for example using hydrofluoric acid.

Alternatively, we could abstain from embodying the vias 15 and ensure the resumption of contact at the Mn-1 level using the vias 38 directly.

The resulting element is represented in FIGS. 6E and 6E'. In FIG. 6E', the passivation layer is not represented.

As has been mentioned above, the NEMS could include more than 6 terminals. For example, they could include 8 independent terminals, that would be connected for example using a BEOL with one or two additional levels of connection, vias through the different levels connecting the connections and terminals.

Thanks to the invention, the result is a system with a high density of NEMS networked and addressable individually.

The system can be used in analyses of a surrounding environment, each NEMS being a sensor. For example, we would form a cover over the NEMS so as to define an analysis chamber or a fluid channel.

Alternatively, the NEMS could each form an actuator, for example to move cells or apply a force on them and measure their stiffness.

Thanks to the invention, we can make NEMS covering about 10% of active surface, whereas the network described in document "*FREQUENCY-ADDRESSED NEMS ARRAYS FOR MASS AND GAS SENSING APPLICATIONS*", E. wise, O. Martin, C. dupre, T. Ernst, G. Billiot, L. Duraffourg, E. and S. Hentz, CEA, LETI, MINATEC Campus Colinet, 17 street of the Martyrs, 38054 GRENOBLE Cedex 9, France. Transducers 2013 2013 Jun. 16-20 Jun. 2013 Barcelona Spain of the state of the art, NEMS covers about 0.1%.

The invention claimed is:

1. A microelectronic system comprising:
   n devices comprising microelectromechanical or nanoelectromechanical devices, n being greater than or equal to 3, the devices arranged on a connection support electrically connecting the n devices,
   each device comprising
      an interaction area,
      at least one mechanical anchor,
      at least one first electrical terminal configured to recover an output signal emitted by the respective device,
      a second electrical terminal, and
      a third electrical terminal, wherein
   each of the first electrical terminal, the second electrical terminal, and the third electrical terminal is located on the connection support and is electrically connected to a conductive track in the connection support, a first pair of adjacent devices being adjacent in a first direction and having in common one of a second electrical terminal and a third electrical terminal,
a second pair of adjacent devices having in common a mechanical anchor,
a third pair of adjacent devices being adjacent in a second direction perpendicular to the first direction and having in common a first electrical terminal,
the first pair of adjacent devices having one device in common with the second pair of adjacent devices and having one device different from the second pair of adjacent devices,
the third pair of adjacent devices having the one device in common with the second pair of adjacent devices and the first pair of adjacent devices and having one device different from the second pair of adjacent devices and the first pair of adjacent devices,
each first electrical terminal, second electrical terminal, and third electrical terminal is common to at most two devices, and
each mechanical anchor is common to at most two devices.

2. The microelectronic system according to claim 1, wherein a relative arrangement of the at least one first terminal, the second terminal, and the third terminal, of the anchor area and the interaction area are identical for the n devices.

3. The microelectronic system according to claim 1, in which, among the n devices, at least some of the devices are arranged so that the at least one first terminal and the second terminal of the first pair of the adjacent devices are coincident, the geometric location of the at least one first terminal and the second terminal of one of the first pair of the adjacent devices being identical to the geometric location of the at least one first terminal and the second terminal of the other of the first pair of said adjacent devices respectively.

4. The microelectronic system according to claim 1, in which interaction areas each extend in a longitudinal direction, the devices being arranged so that longitudinal directions of the interaction areas are coincident or parallel.

5. The microelectronic system according to claim 4, in which the at least one first terminal and the mechanical anchor are each arranged at a longitudinal end of the interaction area, the second and third terminals being arranged laterally relative to the interaction area.

6. The microelectronic system according to claim 1, in which the devices are placed on the connection support according to an in line and column distribution.

7. The microelectronic system according to claim 1, in which the at least one first terminal of a device is coincident with the at least one first terminal of an adjacent device that is different from another adjacent device comprising the second terminal with which the second terminal of the device is coincident.

8. The microelectronic system according to claim 1, in which interaction areas each extend in a longitudinal direction, the devices being arranged so that longitudinal directions of the interaction areas are coincident or parallel, each device comprising a fourth terminal and a fifth terminal, the second terminal and the third terminal being arranged on one side of the interaction area and the fourth terminal and the fifth terminal being arranged on other side of the interaction area.

9. The microelectronic system according to claim 8, in which the second terminal and the third terminal are coincident respectively with the second terminal and the third terminal of a first adjacent device and the fourth terminal and the fifth terminal being coincident with the fourth terminal and the fifth terminal of a second adjacent device different from the first adjacent device.

10. The microelectronic system according to claim 1, in which the n devices are addressable individually and connected by the connection support.

11. A microelectronic system according to claim 10, in which the devices are resonant type, the interaction area being carried by a suspended element configured to be put into vibration and in which the second terminal feeds excitation means of the interaction area, each device having its own resonance frequency.

12. The microelectronic system according to claim 1, in which interaction areas each extend in a longitudinal direction, the devices being arranged so that longitudinal directions of the interaction areas are coincident or parallel, each device comprising a fourth terminal and a fifth terminal, the second terminal and the third terminal being arranged on one side of the interaction area and the fourth terminal and the fifth terminal being arranged on other side of the interaction area, in which the second terminal and the third terminal are coincident respectively with the second terminal and the third terminal of a first adjacent device and the fourth terminal and the fifth terminal being coincident with the fourth terminal and the fifth terminal of a second adjacent device different from the first adjacent device, and in which the third terminal or the fifth terminal is connected to an interaction area displacement detector.

13. The microelectronic system according to claim 12, in which, for each device, a piezoresistive gauge links the interaction element and the third terminal or a piezoresistive gauge links the interaction element and the fifth terminal.

14. The microelectronic system according to claim 1, in which the connection support is comprised of at least one connection level linked to the terminals using vias.

15. The microelectronic system according to claim 14, in which the connection support has several levels of connections linked to the terminals using vias.

16. The microelectronic system according to claim 15, in which the connection support is of type CMOS.

17. A medium analysis system, comprised of the microelectronic system according to claim 1 and a control unit connected to the devices by the connection support.

18. The medium analysis system according to claim 17, configured to analyse a gas and biological cells contained in the gas.

19. The medium analysis system according to claim 17, configured to analyse a liquid and biological cells contained in the liquid.

20. An actuator system, comprised of the microelectronic system according to claim 1 and a control unit connected to the devices by the connection support.

* * * * *